United States Patent

Dordi

[19]

[11] Patent Number: 5,835,355
[45] Date of Patent: Nov. 10, 1998

[54] TAPE BALL GRID ARRAY PACKAGE WITH PERFORATED METAL STIFFENER

[75] Inventor: Yezdi N. Dordi, Palo Alto, Calif.

[73] Assignee: LSI Logic Corporation, Milpitas, Calif.

[21] Appl. No.: 934,529

[22] Filed: Sep. 22, 1997

[51] Int. Cl.⁶ .............................. H05K 7/04; H05K 7/08; H05K 7/20
[52] U.S. Cl. .................. 361/760; 174/260; 174/252; 257/707; 257/738; 361/688; 361/690; 361/692; 361/807; 361/809
[58] Field of Search .................. 29/830–832, 840, 29/483; 174/16.3, 260, 261, 252, 254, 268; 228/180.21, 180.22; 257/700, 697, 698, 704, 707, 708, 710, 712, 713, 718, 719, 723, 724, 728, 738, 773, 772, 778, 779, 780; 361/688, 690, 692, 707, 709, 710, 712, 713, 717–720, 749, 752, 753, 760, 761–764, 777, 779, 783, 818, 807, 809, 748; 165/80.2, 80.3, 185; 438/108, 121, 122, 125–127, 612, 613

[56] References Cited

U.S. PATENT DOCUMENTS

| | | | |
|---|---|---|---|
| 4,953,060 | 8/1990 | Lauffer et al. ........................... | 361/710 |
| 5,045,921 | 9/1991 | Lin et al. . | |
| 5,105,259 | 4/1992 | McShane et al. ....................... | 257/707 |
| 5,216,278 | 6/1993 | Lin et al. ................................ | 257/688 |
| 5,285,350 | 2/1994 | Villaume ................................ | 361/690 |
| 5,369,550 | 11/1994 | Kwon ....................................... | 361/690 |
| 5,397,917 | 3/1995 | Ommen et al. ......................... | 257/698 |
| 5,410,451 | 4/1995 | Hawthorne et al. .................... | 361/760 |
| 5,485,037 | 1/1996 | Marrs ...................................... | 361/688 |
| 5,490,324 | 2/1996 | Newman .................................. | 29/830 |
| 5,506,756 | 4/1996 | Haley ..................................... | 361/789 |
| 5,511,306 | 4/1996 | Denton et al. ........................... | 29/840 |
| 5,550,406 | 8/1996 | McCormick ............................ | 257/666 |
| 5,598,321 | 1/1997 | Mostafazadeh et al. ............... | 361/704 |
| 5,602,422 | 2/1997 | Schueller et al. ....................... | 257/738 |
| 5,620,928 | 4/1997 | Lee et al. ................................ | 438/118 |
| 5,640,048 | 6/1997 | Selna ....................................... | 257/738 |
| 5,652,185 | 7/1997 | Lee . | |
| 5,673,479 | 10/1997 | Hawthorne .............................. | 361/760 |

FOREIGN PATENT DOCUMENTS 4-245668 9/1992 Japan .................... 257/707

OTHER PUBLICATIONS

Huang, et al., "Area Tape Automated Bonding Ball Grid Aray Technology", McGraw–Hill. Inc., pp. 433–464 (1995).

Primary Examiner—Donald Sparks
Attorney, Agent, or Firm—Fitch Even Tabin & Flannery

[57] ABSTRACT

A tape ball grid array (TBGA) package, and a method of making a TBGA package, includes the use of a metal or other stiffener affixed to a flexible tape on which conductive traces connect contact points on an integrated circuit (IC) chip with an array of solder balls. The stiffener is perforated with a pattern of small vent holes. The TBGA package materials are hygroscopic. When the TBGA package is heated during 2nd level packaging, e.g., during solder reflow, moisture absorbed within the hygroscopic materials evaporates and the resulting water vapor is able to escape through the vent holes, rather than becoming trapped within the IC package and introducing various 2nd level packing failure modes.

20 Claims, 4 Drawing Sheets

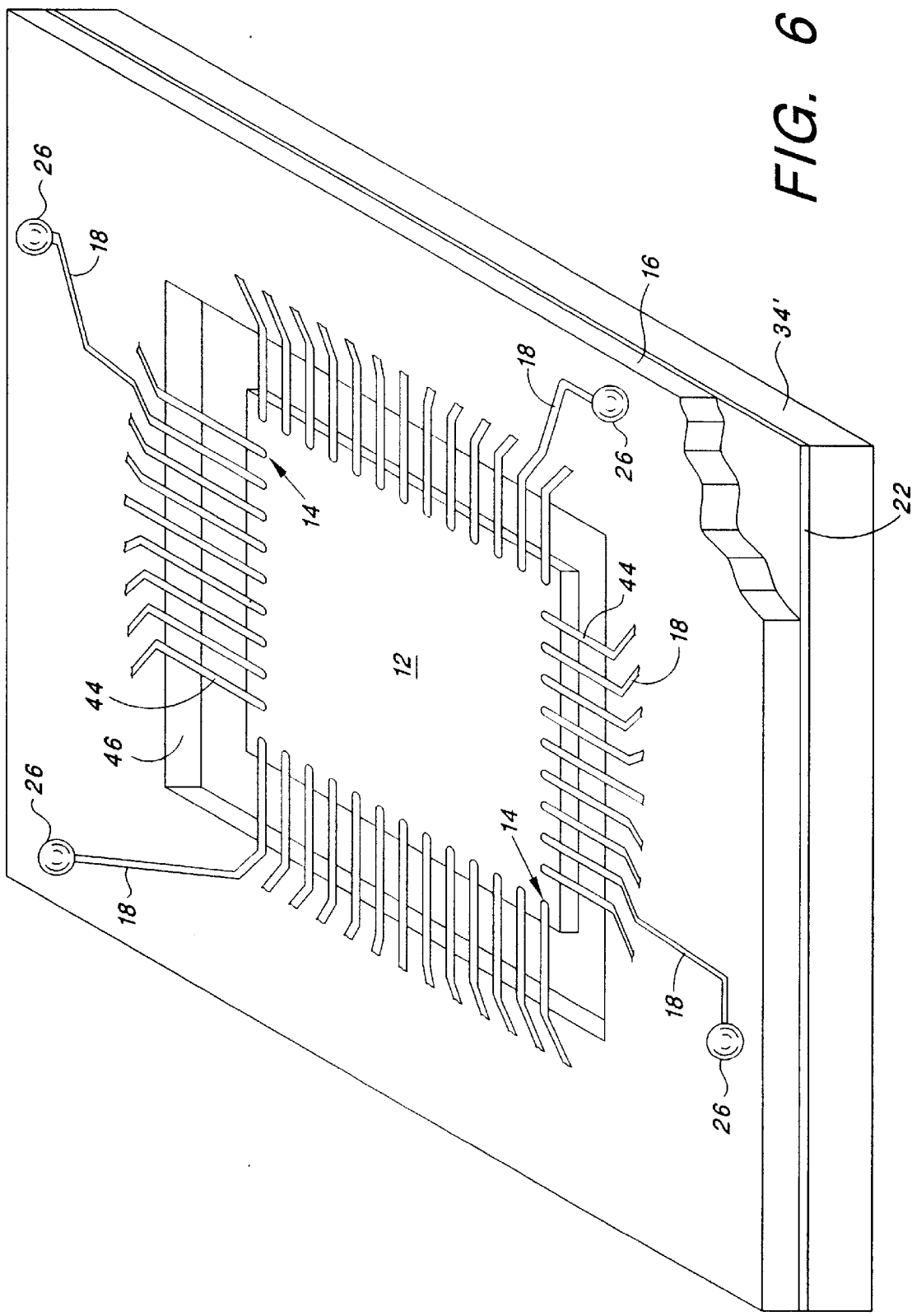

TAPE BALL GRID ARRAY PACKAGE WITH PERFORATED METAL STIFFENER

BACKGROUND OF THE INVENTION

The present invention relates to integrated circuit packages, and more particularly to a tape ball grid array (TBGA) package.

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these products.

The IC chip is not an isolated island. It must communicate with other chips in a circuit through an Input/Output (I/O) system of interconnects. Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

Integrated circuits are typically housed within a package that is mounted to a printed circuit board (PCB). The package has conductive leads or pins that are soldered to the PCB and coupled to the integrated circuit by a lead frame. One type of conventional IC package is a quad flat pack (QFP), which has a plurality of wing shaped leads that extend from each side of the package housing. The outward extension of the wing leads, allows the leads to be readily soldered and inspected after assembly to the printed circuit board. The wing shape of the leads also compensates for any deviation in flatness between the printed circuit board and the package. Improvements in the QFP package include the Thin Quad Flat Pack (TQFP) which provides a lower profile.

As IC devices have increased to higher frequencies and higher power dissipation, the traditional IC packaging approaches have faced drastic challenges. The QFP and TQFP, as used for Surface Mount Technology (SMT), for example, have many physical constraints. These constraints include a relatively large body size, with long winged leads exhibiting high inductance and capacitance, high profiles, and high thermal resistance. These constraints represent major impediments to high-end applications and next-generation Application Specific Integrated Circuits (ASICs) which expand the lead counts beyond 800 and operate at signal speeds of from 100 MHZ to 400 MHZ.

To address these challenges, other types of IC packages have been developed in recent years. The pin grid array (PGA) package, for example, has a matrix of output pins across the bottom surface of the package. The pin grid array increases the I/O of the package. PGA packages are difficult to inspect and may result in poor solder joints, if there is a discrepancy in the length of the pins and/or the flatness in the package or printed circuit board.

U.S. Pat. Nos. 5,045,921 and 5,216,278 issued to Lin et al., which are hereby incorporated by reference in their entirety, disclose an integrated circuit package which has a plurality of solder balls that interconnect the package to a printed circuit board. The Lin package is commonly referred to as a ball grid array (BGA). The solder balls are attached to a polyamide based flexible circuit board which has a number of conductive traces and accompanying solder pads. The IC die is connected to the solder pads of the flexible circuit by wire bonds, and electrically coupled to the solder balls through conductive traces routed across the flexible circuit. Vias are formed in the polyamide to interconnect each side of the flexible circuit.

The integrated circuit die (chip) of the BGA packages is mounted to a substrate and enclosed by a rigid housing or lid, typically constructed from a molded plastic material. The solder balls are relatively flexible and can thus compensate for any lack of flatness in the printed circuit board or package. Additionally, the solder balls are assembled in an array on the bottom of the package, and thus provide a relatively high throughput.

A variation of the BGA package that has been introduced recently is the Area Tape Automated Bonding (ATAB) Ball Grid Array (BGA) package, or more commonly referred to as simply the "Tape Ball Grid Array" (TBGA) package. The TBGA package advantageously provides high lead counts, as well as a thin, lightweight, high electrical and thermal performance, and a BGA surface mount.

The conventional TBGA package consists of a tape with 2-layer copper sandwiched between a 2-mil thick polyimide dielectric. At least one layer of the copper is formed into traces or conductors that interconnect gold bumps or C4 bumps on the chip (which provide electrical interconnect points with the chip) to a printed circuit board (PCB) through solder balls made from solder comprising a 10/90 ratio of Sn/Pb or other eutectic material. See, Lau, John H. (Ed.), *Ball Grid Array Technology*, Chapter 14 "Area Tape Automated Bonding Ball Grid Array Technology" (McGraw-Hill, 1995), incorporated herein by reference.

A stiffener, or heat spreader, is placed around the die (chip), and is held in place by a suitable adhesive. The stiffener is made of a sheet of solid metal or other solid material having a coefficient of thermal expansion (CTE) matching the CTE of the PCB carrier or other substrate to minimize thermal stress on the package and assembly during thermal cycling. The main function of the stiffener is to provide rigidity and planarity to the TBGA package.

In the IC packaging industry, it is common to refer to the placement of the IC chip within a suitable package (whether a package of the QFP family, the BGA family, or any other IC package family) as "1st level" packaging. The placement or mounting of the IC package on a suitable printed circuit board (PCB) or other substrate, is referred to as "2nd level" packaging. The interconnection of the various PCB's or other carriers within an electronic system, e.g., through use of a motherboard, is referred to as "3rd level" packaging.

The TBGA package, as well as many other types of IC packages, are moisture sensitive. That is, the materials used within the IC package, e.g., polyimide or epoxy, are hygroscopic materials that absorb moisture from the surrounding air. When the IC package is assembled and formed at 1st level packaging, the hygroscopic materials may be dry. However, when left exposed to the surrounding air, such hygroscopic materials absorb moisture, until they eventually become saturated.

During 2nd level packaging, when the IC package is subjected to sufficient heat in order to be soldered to a PCB, e.g., during a solder reflow process, such moisture evaporates. Unless the evaporated moisture has some place to go, the evaporated moisture (now a gas) builds up a significant pressure at the material interfaces within the IC package, and may cause the IC package to blow apart, delaminate or experience other failure modes. Such failures may significantly reduce the 2nd level packaging yield. Unfortunately, the heat spreader or stiffener commonly used in TBGA packages acts as a barrier that tends to trap the moisture within the package, thereby making the types of failures mentioned above more prevalent. What is needed, therefore, is a TBGA package that prevents or minimizes the build-up of pressure from evaporated moisture within the TBGA package during 2nd level packaging, and thereby improves the 2nd level yield.

SUMMARY OF THE INVENTION

The present invention addresses the above and other needs by providing a TBGA package, and a method of making a TBGA package, that improves the yield achieved with such package during 2nd level packaging operations. More particularly, the present invention provides a TBGA package wherein the stiffener and/or heat spreader (which are usually made of metal, but could be made from any suitable material) are perforated with a pattern of small holes, thereby allowing moisture formed during 2nd level packaging, e.g., during solder reflow, to vent through such holes. Advantageously, by preventing moisture from being trapped by the stiffener and/or heat spreader in this manner, the previously-encountered problems associated with trapped moisture during 2nd level packaging are significantly minimized.

In accordance with one aspect of the invention, a TBGA package is provided that includes: (a) an integrated circuit chip having a first surface whereon contact pads are located, the contact pads representing electrical interconnection points of the chip; (b) a non-conductive tape having a plurality of conductive traces coupled to the contact pads of the chip; (c) a plurality of solder balls coupled to the plurality of conductive traces; and (d) a stiffener affixed to the tape that has a plurality of vent holes therein.

In accordance with another aspect of the invention, a method of making a TBGA integrated circuit (IC) package is provided that includes the steps of: (1) forming conductive traces on a first surface of a non-conductive tape; (2) electrically connecting contact pads of an IC chip to the conductive traces on the tape; (3) electrically coupling respective solder balls on a second surface of the tape to the conductive traces; and (4) attaching a perforated stiffener material to the non-conductive tape. The perforated stiffener, as its name implies, has a plurality of small vent holes therein. These vent holes thus provide a channel through which moisture or other gases or contaminants may be vented during 2nd level packaging.

It is thus a feature of the invention to provide a TBGA IC package that allows moisture to vent therefrom during 2nd level packaging operations.

It is another feature of the invention to provide a TBGA IC package that prevents moisture or gases from being trapped during a 2nd level packaging operation.

It is a further feature of the invention to provide a TBGA IC package wherein evaporated moisture can readily vent during a 2nd level packaging operation, and wherein the heat spreading and/or heat sinking capacity of the stiffener and/or heat spreader used with such package are not materially altered.

It is yet an additional feature of the invention to provide a method of making a TBGA IC package during 1st level packaging that improves the yield of such TBGA package during a 2nd level packaging operation.

BRIEF DESCRIPTION OF THE DRAWINGS

The above and other aspects, features and advantages of the present invention will be more apparent from the following more particular description thereof, presented in conjunction with the following drawings wherein:

FIG. 6 is a perspective view the underneath side of a portion of the alternative TBGA package shown in FIG. 5.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
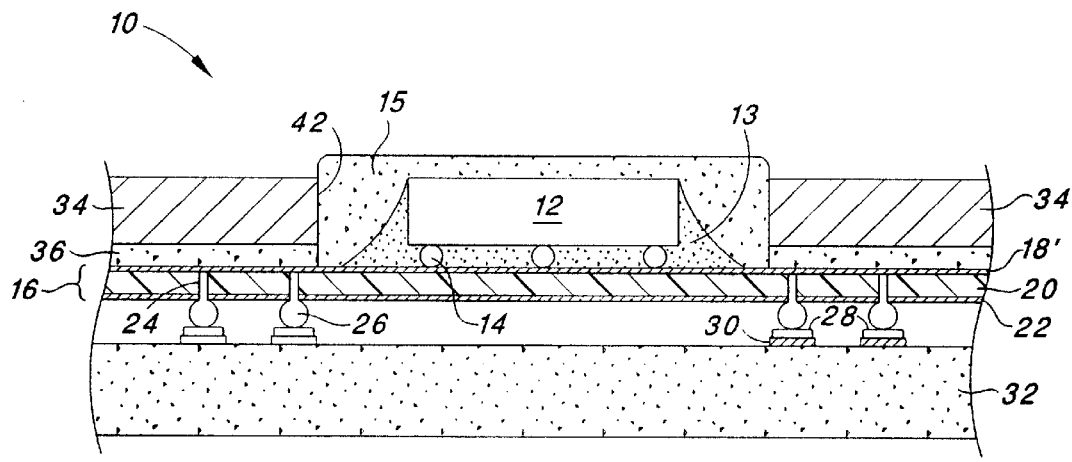
FIG. 1 is a cross-sectional view of one type of TBGA package.

FIG. 1 shows a cross-sectional view of one type of TBGA package 10 which could incorporate the present invention. The type of package shown in FIG. 1 is sometimes referred to as a "flip chip", and is characterized by not employing any wire bonds. The TBGA package 10 includes a chip 12 having bumps 14 (e.g. gold bumps) that represent the interconnection points of the chip. These interconnection points may also be pads, and thus may be referred to as first surface pads (the "first surface" referring to a surface of the chip 12). The bumps or pads 14 connect to selected traces 18 (not visible in FIG. 1) on one side of one or a two-layer thin tape 16, typically made of a polyimide material or other dielectric 20 sandwiched between two layers of copper 18' and 22. The copper layer 18' has a pattern of traces 18 formed thereon (not visible in FIG. 1) that electrically connect selected bumps 14 of the chip 12, through vias 24, to solder balls 26. In this respect, the tape 16 thus functions as a mini PCB that selectively connects the bumps 14 of the chip 12 to desired solder balls 26 located on the other side of the tape 16. Thus, the tape 16 shown in FIG. 1 is referred to as a double layer tape (because electrical connections are made on both sides of the tape). The solder balls 26, are arranged in a ball grid array, as is known in the art, and are adapted for connection to metal traces or pads 30 on the surface of a printed circuit board (PCB) 32. A thin layer or film of solder paste 28 may be spread over the PCB traces or pads 32 before soldering the solder balls 26 thereto in order to facilitate the solder connection, as is known in the art. The soldering of the balls 26 to the traces or pads 30 is performed in conventional manner, e.g., through a solder reflow operation.

A suitable encapsulant 13 may be used to hold the chip 12 in its desired position against the tape 16. Further, an adhesive 36 may be used to hold a stiffener 34 against the tape 16, thereby imparting desired rigidity into the IC package. The stiffener 34 is usually made from metal or other material having a coefficient of thermal expansion matching the coefficient of thermal expansion of the PCB 32. A filler material 15, e.g., epoxy or other suitable protective material or encapsulant, may then be placed over the chip 12 in order to fill in voids and cover the chip 12 to help protect it. Thus, in this or an equivalent manner, the die or chip 12 is encapsulated with encapsulant 13 and/or 15 after attachment is made to the bumps 14.

It is noted that heat generated within the chip 12 is coupled through the encapsulant protective layer 15 to the surrounding environment, or through the encapsulants 13 and 15 and/or the tape 16 to the stiffener 34, and through the solder balls 26 to the PCB 32. Thus, in some respects, the stiffener 34 also functions as a heat sink or heat spreader. That is, the stiffener 34 helps keep the surface of the chip cool during operation, which in turn helps maintain the junction temperature of the various devices included on the chip at safe operating levels.

The main purpose of the stiffener 34 is to add rigidity and planarity to the TBGA package 10.

Disadvantageously, as mentioned previously, when heat is applied to the TBGA package 10, such heat causes any moisture in the package, e.g., absorbed within the hygroscopic dielectric layer 20, or within other hygroscopic materials used within the package 10, to evaporate. Such evaporated moisture may be trapped by the heat spreader or stiffener 34, thereby building up sufficient pressure to cause the IC package to delaminate or experience other types of failures.

Figure 2:
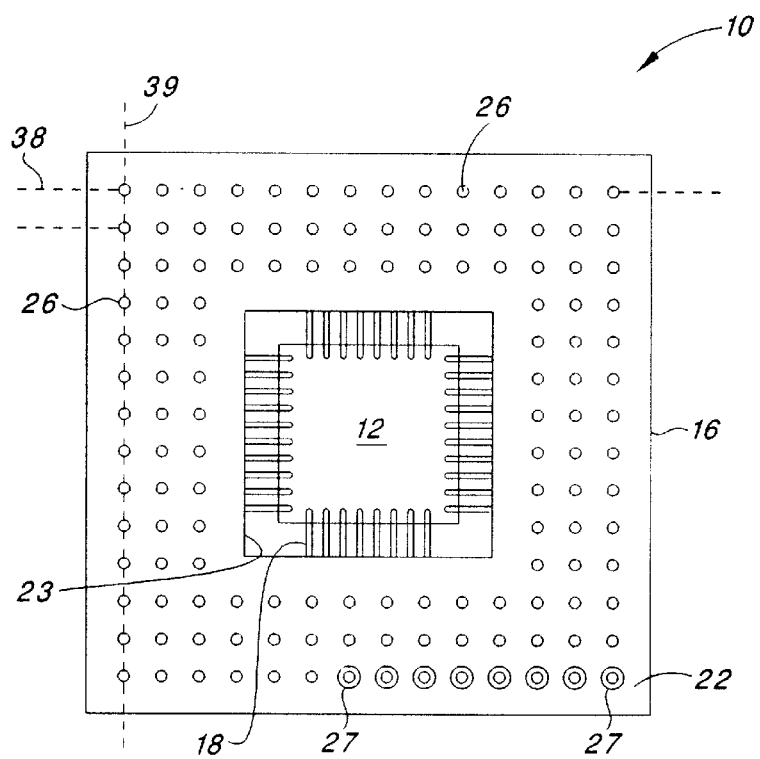
FIG. 2 is a plan view of the underneath side of a the TBGA package of FIG. 1, showing the array of solder balls thereon which are used to connect with conductive traces or pads on a printed circuit board (PCB) during a 2nd level packaging operation.

FIG. 2 shows a plan view of the array of solder balls 26 that is formed on the underneath side (the side that attaches to the PCB) of the TBGA package 10. As seen in FIG. 2, the solder balls 26 are typically arranged in rows 38 and columns 39. An opening 23 is generally included in the tape 16, as seen in FIG. 2. The placement of the chip 12 in the center of the opposite side of the tape is thus readily evident through this opening, as shown in FIG. 2. If there is a conductive layer 22 on the underneath side of the tape 16, e.g., when two-layer tape is used, then such layer may be used as a voltage or ground plane. If so, then suitable open regions 27 are made in the layer 22 to prevent the solder balls from shorting to the layer 22, and/or from shorting to each other through the layer 22. (Only a few of the open regions 27 are shown in FIG. 2, but it is to be understood that such open regions would be used whenever the copper layer 22 remains on the underneath side of the tape as a voltage or ground plane.)

Unfortunately, for TBGA packages of the prior art, when significant heat is applied at the interface between the PCB 32 and the solder balls 26 (see FIG. 1), as occurs during the solder reflow process during 2nd level packaging, moisture evaporates and is trapped by the stiffener 34 within the package, causing the package to delaminate or experience other failure modes, thereby reducing the 2nd level yield.

Figure 3:
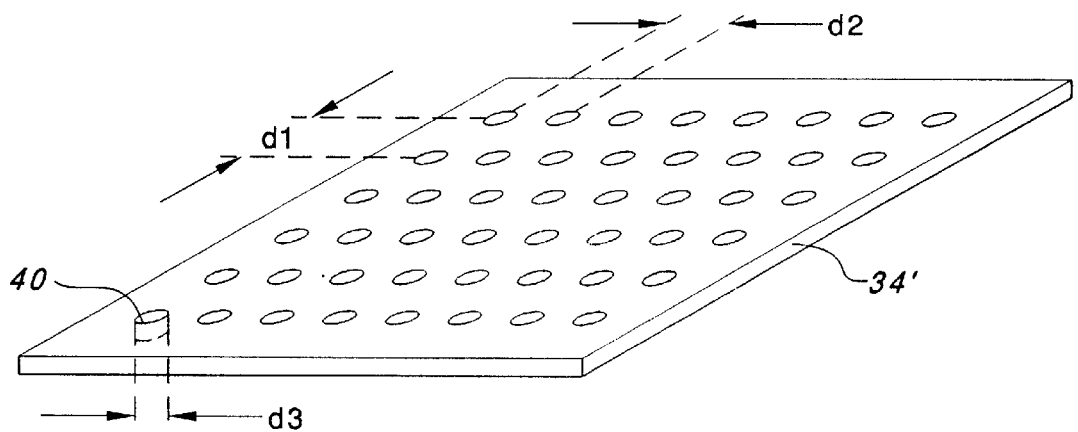
FIG. 3 shows a segment of a perforated stiffener or heat spreader made in accordance with the present invention.

In order to address this problem, the present invention advantageously provides vent holes or openings 40 in a stiffener 34', as illustrated in FIG. 3. Such openings 40 are typically arranged in an linear array of rows and columns, as shown in FIG. 3, which shows a portion of a stiffener 34' made in accordance with the present invention. It is noted, however, that the vent holes 40 need not necessarily be arranged in a linear array as shown in FIG. 3, but may be arranged in any suitable pattern, whether an ordered pattern or a random pattern.

The vent holes 40 have a diameter d3 and are spaced in accordance with any desired grid spacing and/or pattern. For example, as mentioned above, a linear pattern may be employed, wherein rows of vent holes 40 are separated from each other by a distance d1, and wherein columns of vent holes are similarly separated by a distance d2. Typically, the values of d1 and d2 are on the order of 50 mils (0.050 inches, or 1.27 mm), but may assume values from 20 mils (0.020 inches, or 0.51 mm) to 200 mils (0.200 inches, or 5.08 mm). The diameter d3 of the vent holes 40 is typically on the order of 20 mils (0.020 inches, or 0.51 mm), but may range from 0.010 inches (0.254 mm) to 0.100 inches (2.54 mm).

The thickness of the stiffener 34 is typically around 10–20 mils (0.254–0.51 mm), but may assume any value as is known in the art. (The thickness of the stiffener is typically an industry specified value). Representative materials from which the stiffener 34 may be made include aluminum, copper, and nickel, or alloys thereof, and sometimes these metals may include a plating of gold or nickel. The size and spacing of the vent holes 40 is selected so as not to materially alter the thermal, stiffness and planarity properties of the stiffener 34'. It is important that the vent holes 40 not be plugged up with any other material, unless that material is moisture permeable. Otherwise, the vent holes will not be able to perform their intended function of providing an escape vent through which water vapor or other gases may be released.

Figure 4:
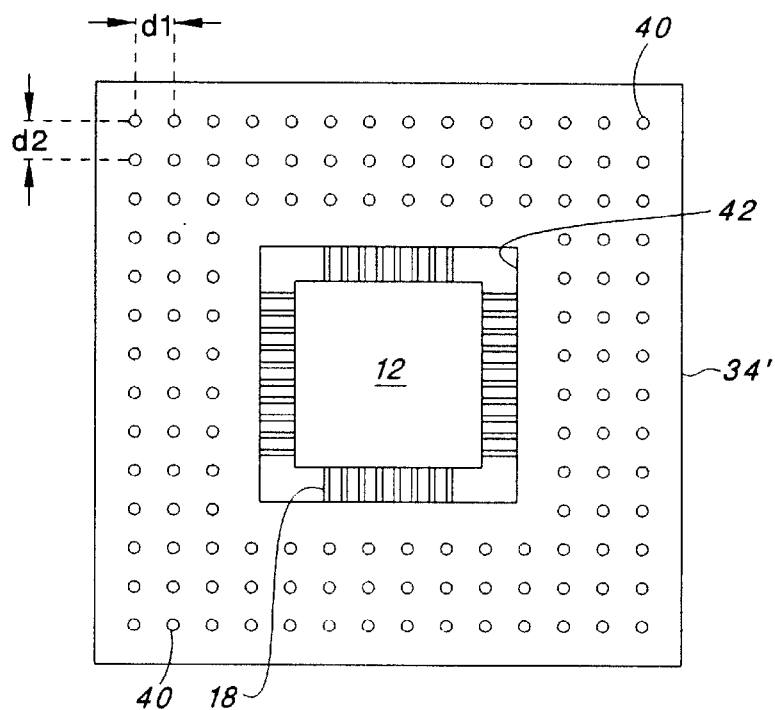
FIG. 4 shows a plan view of an upper side of a TBGA package utilizing a perforated stiffener in accordance with the invention.

Turning next to FIG. 4, a plan view of an upper side of a TBGA package utilizing a perforated stiffener 34' in accordance with the invention is illustrated. Note that an opening 42 is centrally located in the stiffener 34' and the chip 12 is positioned within this opening. Thus, for the configuration shown in FIG. 4, the stiffener 34' surrounds the chip 12.

The number and arrangement of vent holes 40 shown in FIG. 4 is meant to teach the concept of using vent holes, but is not necessarily meant to show the actual number and arrangement of holes that may be used in an TBGA package. A typical TBGA package may have outer dimensions of 15 mm by 15 mm, up to 50 mm by 50 mm, with an array of 11 by 11 up to 49 by 49 solder balls on its lower surface for attachment to a PCB. For such a representative TBGA, the number of vent holes 40 used in the stiffener 34' may range from one vent hole per solder ball (1:1) to one vent hole per four solder balls (1:4), or (in some instances) one vent hole per eight solder balls (1:8) or one vent hole per sixteen solder balls (1:16). The exact ratio of solder balls to vent holes is not as critical as is the fact that at least one vent hole be provided so allow water vapor and any other gases formed during 2nd level packaging to escape from the package. Thus, embodiments of the invention may include other numbers of vent holes and arrangements thereof in a suitable pattern spread over the surface of the stiffener 34'. The purpose of the vent holes 40 is allow evaporated moisture or other gases to escape from the package during 2nd level packaging, rather than being trapped therein. Thus, even one vent hole may be sufficient in some instances to serve this purpose; but generally, an array or pattern of many vent holes will be used.

Figure 5:
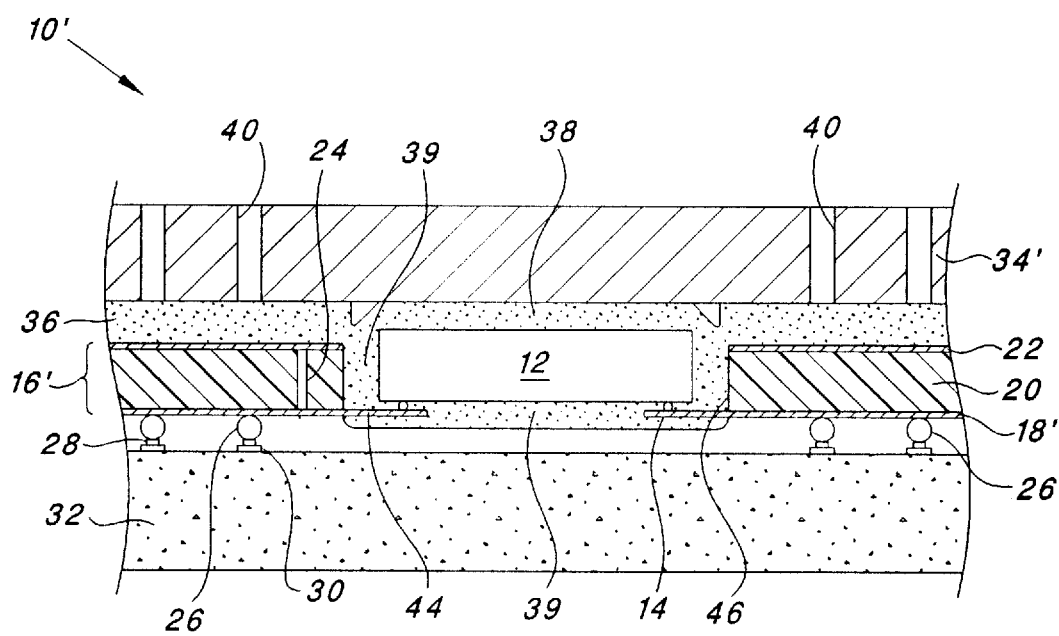
FIG. 5 is a cross-sectional view of an alternative TBGA package made in accordance with the present invention.

Turning next to FIG. 5, a cross-sectional view of an alternative TBGA package 10' made in accordance with the present invention is illustrated. In FIG. 5, the chip 12 is positioned within an opening 46 of a tape 16'. While the tape 16' may have two conductive layers 18' and 22 separated by a dielectric or insulative layer 20, as does the tape 16 of FIG. 1, the individual traces 18 placed on the conductive layer 18' for the tape 16' shown in FIG. 5 are on the same side as, and thus connect directly to, the solder balls 26 without the use of, or need for, vias 24 to connect from one side of the tape 16 to the other.

Where electrical connection is needed to the conductive layer 22 on the other side of the tape 16', e.g., when such layer 22 is used as a voltage or ground plane, a via 24 may be used to connect to such layer. Alternatively, other suitable electrical connection means may be used to electrically connect to the layer 22, e.g., a conductive strap or wire may be soldered to the layer 22 and pass through the opening 46 to connect to a desired trace 18 or contact point on the opposite side of the tape 16'.

As illustrated in FIG. 5, the chip 12 is secured to the stiffener 34' through the use of a suitable die attach material 38. The tape 16' is secured to the stiffener 34' through the use of a suitable adhesive 36. The adhesive 36 may be the same as, or different from, the die attach material 38. The bumps 14, or other attachment pads on the surface of the chip 12 (i.e., the first surface pads), are connected to traces 18 of the tape 16' via trace extensions 44 that extend or bridge from the edge of the opening 46 to the edge of the chip 12. The trace extensions 44 may comprise conductive wires that are bonded at each end to the trace 18 and the pad 14, or they may comprise actual extensions of the trace 18 on the tape 16. A suitable encapsulant 39, as is known in the art, may also be used to fill in any remaining space or voids within the opening 46, as well as to encapsulate or cover (and thus protect) the chip 12.

The adhesive 36 used to secure the stiffener 34' to the tape 16 is preferably made from a material that is moisture permeable, thereby allowing moisture to readily pass therethrough. In this way, the adhesive 36 does not block or prevent the vent holes 40 from performing their intended function of allowing gases, e.g., water vapor, to escape therethrough.

Any suitable commercially-available adhesive 36, and/or die attach agent or material 38, and/or encapsulant 39, may be used within the TBGA package in accordance with the present invention.

It should be noted, particularly for the TBGA package embodiment shown in FIG. 5, that the stiffener 34' may also serve the function of a heat sink. This is accomplished by extending the spreader 34' over the top surface of the chip 12 (i.e., the surface opposite the chip contact pads 14) and selecting the die attach material 38 so that it exhibits appropriate thermal conducting characteristics.

FIG. 6 shows a partial perspective view of the chip 10' of FIG. 5 viewed from the bottom side of the chip, i.e., viewed from that side of the chip 10' that attaches to the PCB 32. For clarity, no encapsulant or filler 39 is shown in FIG. 6, but it is to be understood that such encapsulant is used to fill in the remaining space within the opening 46 of the tape 16'. As seen in FIG. 6, extensions 44 of the individual traces 18 on the bottom surface of the tape 16' are connected to the bumps or other contact points 14 on the bottom surface of the chip 12. The other conductive surface 22 of the tape 16' (i.e., the top surface of the tape 16' as oriented in FIG. 5, but which appears as the bottom surface as oriented in FIG. 6) typically has one or more conductive planes 22 thereon that may serve as voltage and/or ground planes, as explained previously.

As suggested in FIG. 6, but as shown for only a few of the traces 18 (with the remaining traces being omitted for clarity), each of the traces 18 spread out across the surface of the tape 16 and interconnect to respective solder balls 26. The solder balls 26 are arranged in a suitable pattern or array, e.g., as shown in FIG. 2, so that they align with and may be soldered to appropriate pads 30 on the PCB 32, thereby providing both electrical and mechanical attachment of the chip 10' to the PCB 32.

As described above, it is thus seen that the present invention advantageously provides a TBGA IC package that allows moisture to vent therefrom during 2nd level packaging, thereby preventing moisture or gases (e.g., absorbed within the hygroscopic materials of the package and evaporated therefrom during 2nd level packaging) from being entrapped within the package during a 2nd level packaging operation, which entrapment could otherwise introduce numerous failure modes.

It is further seen that the invention not only provides a TBGA IC package wherein water vapor or other gases can readily vent during the 2nd level packaging operation, but also does so without materially altering the heat spreading and/or heat sinking capacity of the stiffener and/or heat spreader used with such package.

Additionally, it is seen that the invention provides a TBGA IC package and a method of making a TBGA IC package during 1st level packaging that improves the yield of such TBGA package during 2nd level packaging.

While the invention herein disclosed has been described by means of specific embodiments and applications thereof, numerous modifications and variations could be made thereto by those skilled in the art without departing from the scope of the invention set forth in the claims.

What is claimed is:

1. An electronic package, comprising:
   an integrated circuit chip having a first surface whereon contact pads are located, said contact pads representing electrical interconnection points of the chip;
   a non-conductive tape having a plurality of conductive traces electrically coupled to the contact pads of the chip;
   a plurality of solder balls coupled to the plurality of conductive traces; and
   a stiffener affixed to the tape that has a plurality of vent holes therein.

2. The electronic package of claim 1 wherein the vent holes are distributed over the surface of the stiffener in a prescribed array.

3. The electronic package of claim 2 wherein the prescribed array strategically positions at least one vent hole for each n solder balls, where n is an integer.

4. The electronic package of claim 3 wherein n is one.

5. The electronic package of claim 3 wherein n is four.

6. The electronic package of claim 1 wherein there is at least one vent hole for each 16 solder balls.

7. The electronic package of claim 1 wherein the vent holes have a diameter of at least 0.254 mm (0.010 inches).

8. The electronic package of claim 7 wherein the vent holes have a diameter no greater than about 2.54 mm (0.100 inches).

9. The electronic package of claim 7 wherein the vent holes are arranged in a linear array made up of rows and columns, and wherein the rows are separated by a distance that is at least about 0.51 mm, and the columns are separated by a distance that is at least about 0.51 mm.

10. A tape ball grid array (TBGA) integrated circuit (IC) package for housing a semiconductor integrated circuit (IC) chip, said IC chip having contact pads thereon, comprising:

means for electrically connecting the contact pads of the IC chip to conductive traces on a first surface of a tape;

means for electrically coupling solder balls on a second surface of the tape to each conductive trace connected to a contact pad of the IC chip; and stiffener means for adding rigidity to said tape, said stiffener means having vent means therein for venting water vapor or other gases absorbed within the tape or other materials of the TBGA IC package during a second level packaging operation.

11. The TBGA IC package set forth in claim 10 wherein said stiffener means comprises a perforated rigid stiffener affixed to a surface of the tape, said perforated rigid stiffener having a plurality of vent holes therethrough.

12. The TBGA IC package set forth in claim 10 wherein said stiffener means comprises a sheet of rigid material affixed to a surface of the tape, and wherein said vent means comprises at least one vent hole therethrough.

13. The TBGA package set forth in claim 11 wherein the sheet of rigid material comprises a metal.

14. The TBGA package set forth in claim 11 wherein the size of the vent holes within the stiffener ranges between about 0.254 mm to 2.54 mm in diameter.

15. The TBGA package set forth in claim 14 wherein the ratio of vent holes to solder balls varies between 1:16 and 1:1.

16. The TBGA package set forth in claim 11 further including a porous adhesive that bonds said stiffener means to a surface of the tape, the porous adhesive comprising a material that allows water vapor or other gases to pass therethrough.

17. The TBGA package set forth in claim 11 further including an adhesive that bonds said stiffener to a surface of the tape without blocking all of the vent holes that pass through the stiffener.

18. A method of making a tape ball grid array (TBGA) integrated circuit package wherein an integrated circuit (IC) chip, having contact pads on one surface thereof, is housed, said method comprising:

forming conductive traces on a surface of a non-conductive tape;

electrically connecting the contact pads of the IC chip to the conductive traces on the tape;

electrically coupling a solder ball to each conductive trace connected to a contact pad of the IC chip; and attaching a perforated stiffener material to the non-conductive tape, said perforated stiffener having a plurality of vent holes therein, thereby providing an escape channel through which a gas, such as water vapor, may vent during a second level packaging operation.

19. The method of making a TBGA IC package as in claim 18 further comprising forming at least one vent hole in said perforated stiffener for each n solder balls of the IC chip, where n is an integer of at least 1.

20. The method of making a TBGA IC package as in claim 18 wherein the step of attaching the perforated stiffener to the non-conductive tape comprises bonding the perforated stiffener to the non-conductive tape using an adhesive that does not prevent gases from venting through at least some of the vent holes in the stiffener.

* * * * *